(12) United States Patent
Lee et al.

(10) Patent No.: US 8,026,044 B2
(45) Date of Patent: Sep. 27, 2011

(54) METHOD OF FORMING FINE PATTERNS OF SEMICONDUCTOR DEVICE

(75) Inventors: Doo-youl Lee, Seoul (KR); Han-ku Cho, Seongnam-si (KR); Suk-joo Lee, Yongin-si (KR); Gi-sung Yeo, Seoul (KR); Pan-suk Kwak, Hwaseong-si (KR); Min-jong Hong, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 1098 days.

(21) Appl. No.: 11/781,987

(22) Filed: Jul. 24, 2007

(65) Prior Publication Data
US 2008/0206686 A1   Aug. 28, 2008

(30) Foreign Application Priority Data
Feb. 28, 2007 (KR) .................. 10-2007-0020574

(51) Int. Cl.
*G03F 7/00* (2006.01)
*G03F 7/004* (2006.01)
*G03F 7/20* (2006.01)
*G03F 7/26* (2006.01)
*G03F 7/40* (2006.01)

(52) U.S. Cl. ............... 430/312; 320/270.1; 320/311; 320/330; 320/331; 320/313; 320/317; 320/394

(58) Field of Classification Search .......... 430/270.1, 430/311, 312, 313, 314, 317, 330, 331, 394, 430/396
See application file for complete search history.

(56) References Cited

U.S. PATENT DOCUMENTS

| | | | |
|---|---|---|---|
| 5,654,897 A * | 8/1997 | Tripathi et al. | 438/599 |
| 6,737,199 B1 * | 5/2004 | Hsieh | 430/5 |
| 7,429,536 B2 * | 9/2008 | Abatchev et al. | 438/725 |
| 7,666,578 B2 * | 2/2010 | Fischer et al. | 430/314 |
| 7,700,997 B2 * | 4/2010 | Futatsuyama et al. | 257/326 |
| 7,776,744 B2 * | 8/2010 | Sandhu et al. | 438/689 |

(Continued)

FOREIGN PATENT DOCUMENTS

JP    2002-064043    2/2002

(Continued)

OTHER PUBLICATIONS

Ikeda et al., "Optical Proximity Correction Feature Extraction Method Using reticle Scanning Electron Microscope Images", Jpn. Journal of Applied Physics, vol. 42 pp. 3937-3941 (2003).*

*Primary Examiner* — Amanda C. Walke
(74) *Attorney, Agent, or Firm* — Volentine & Whitt, PLLC

(57) ABSTRACT

A method of forming fine patterns on a semiconductor substrate includes forming a first pattern, including first line patterns having a feature size F and an arbitrary pitch P, and forming a second pattern, including second line patterns disposed between adjacent first line patterns, to form a fine pattern having a half pitch P/2, the first and second line patterns being repeated in the first direction. A gap is formed in at least one first line pattern in a second direction, perpendicular to the first direction, to connect second line patterns positioned on each side of the first line pattern through the gap. At least one jog pattern, extending in the first direction, is formed from at least one first line pattern adjacent to the connected second line patterns. The jog pattern causes a gap in at least one of the connected second line patterns in the second direction.

20 Claims, 9 Drawing Sheets

U.S. PATENT DOCUMENTS

| | | | |
|---|---|---|---|
| 7,790,357 B2 * | 9/2010 | Jung | 430/311 |
| 7,795,149 B2 * | 9/2010 | Sandhu | 438/694 |
| 7,883,836 B2 * | 2/2011 | Koo | 430/313 |
| 2006/0234166 A1 | 10/2006 | Lee et al. | |
| 2006/0240361 A1 | 10/2006 | Lee et al. | |
| 2008/0241734 A1 * | 10/2008 | Liu et al. | 430/253 |
| 2009/0007053 A1 * | 1/2009 | Kim | 716/21 |
| 2010/0167537 A1 * | 7/2010 | Aton | 438/674 |
| 2011/0059403 A1 * | 3/2011 | Sukekawa | 430/312 |
| 2011/0159443 A1 * | 6/2011 | Ryou et al. | 430/312 |

FOREIGN PATENT DOCUMENTS

| | | |
|---|---|---|
| KR | 10-2006-0110706 | 10/2006 |
| KR | 10-0640640 | 10/2006 |

* cited by examiner

METHOD OF FORMING FINE PATTERNS OF SEMICONDUCTOR DEVICE

CROSS-REFERENCE TO RELATED PATENT APPLICATION

A claim of priority is made to Korean Patent Application No. 10-2007-0020574, filed on Feb. 28, 2007, the subject mater of which is hereby incorporated by reference.

BACKGROUND OF THE INVENTION

1. Field of the Invention

The present invention relates to a method of forming a fine pattern of a semiconductor device. More particularly, the present invention relates to using double patterning to form a layout of a semiconductor device having a fine pattern.

2. Description of the Related Art

Circuit patterns in highly integrated semiconductor devices must be especially fine to accommodate the circuit layouts. In other words, individual unit devices must be small in order to incorporate several such unit devices in a limited space. Accordingly, the pitch of a semiconductor pattern (i.e., the sum of the widths and gaps of the patterns to be formed) must be minimized. However, as a practical matter, formation of patterns having fine pitches is limited by the resolution capabilities of the photolithography process used to form the patterns, such as the line and space patterns, of the semiconductor device. In other words, the higher the resolution of the photolithography process, the finer the formation of the pattern.

A double patterning process addresses, to some extent, resolution limitations of the photolithography process for forming fine patterns. According to this process, first line patterns are formed using exposing and developing processes, while second line patterns are formed among the first line patterns relying on the semiconductor fabrication process.

However, when lines and other features of the first line patterns are cut or separated, by design or during the fabrication process, a second pattern layer may be deposited in the gaps between the severed portions of first line pattern. As a result, portions of the second line pattern may unintentionally be connected (or short-circuited) to one another. This connection may require an additional trimming process to separate the connected portions of the second line pattern. Such a trimming process complicates the fabricating process and reduces economic efficiency.

SUMMARY OF THE INVENTION

An aspect of the present invention provides a method of forming fine patterns of a semiconductor device, including forming first and second patterns on a semiconductor substrate. The first pattern includes first line patterns, having a feature size F and an arbitrary pitch P, and being repeated in a first direction. The second pattern includes second line patterns formed between adjacent first line patterns to form a fine pattern having a half pitch P/2, the second line patterns being repeated in the first direction. Each of the second line patterns may have a width of ¼ of the pitch P. The method further includes forming a gap in at least one first line pattern in a second direction, perpendicular to the first direction, to connect second line patterns positioned on each side of the at least one first line pattern through the gap. The gap in the first line pattern may exceed twice the feature size F. At least one jog pattern is formed, extending in the first direction from at least one of the first line patterns adjacent to the connected second line patterns. The jog pattern causes a gap in at least one of the connected second line patterns in the second direction. A distance in the first direction between an end of the jog pattern and a first line pattern adjacent to the jog pattern is less than twice the feature size F.

Forming the first pattern may include use of an illumination system of a photolithography apparatus, such that a resolution is more finely adjusted in the first direction than in the second direction. Also, a first one of the first line patterns and an adjacent first one of the second line patterns may be classified into a first group, and a second one of the first line patterns and an adjacent second one of the second line patterns may be classified into a second group, such that the first and second line patterns of the second group extend in an opposite direction from the first and second line patterns of the first group. The first and second groups may be repeated in the first direction.

Another aspect of the present invention provides a method of forming fine patterns of a semiconductor device, which may include line and space patterns. The method includes forming a first pattern on a semiconductor substrate, the first pattern having multiple first line patterns with a pitch P and a feature size F, and being repeated in a first direction; forming a capping layer over upper surfaces and sidewalls of each of the first line patterns, the capping layer defining recesses between adjacent first line patterns; and forming a second pattern having multiple second line patterns, the second line patterns being repeated in the first direction in the recesses. The capping layer is anisotropically etched, using the first line patterns and the second line patterns as etch masks, to form a fine pattern having a half pitch P/2. A gap is formed in at least one first line pattern in a second direction, perpendicular to the first direction, to connect second line patterns, positioned on each side of the first line pattern, through the gap in the first direction. At least one jog pattern, extending in the first direction from at least one first line pattern adjacent to the connected second line patterns, is formed to cause formation of a gap in at least one of the connected second line patterns in the second direction. The gap may exceed twice the feature size, and the feature size may be equal to a thickness of the capping layer. Also, a distance in the first direction between an end of the jog pattern and a first line pattern adjacent to the jog pattern is less than twice the feature size. Forming the second pattern may include forming a second pattern layer (having etch selectivity with the capping layer) on the capping layer, and removing a portion of the second pattern layer to form the second line patterns in the recesses. Removing the portion of the second pattern layer may include wet etching.

Yet another aspect of the present invention provides a method of forming fine patterns of a semiconductor device. The method includes forming a first pattern on a semiconductor substrate, the first pattern including first line patterns having a pitch P and a feature size F, and being repeated in a first direction; forming a capping layer over upper surfaces and sidewalls of each of the first line patterns, the capping layer defining recesses between adjacent first line patterns; and forming a second pattern including second line patterns, the second line patterns being repeated in the first direction in the recesses. The capping layer is etched using the first line patterns and the second line patterns as etch masks to form a fine pattern having a half pitch P/2. A gap is formed in at least one first line pattern in a second direction, perpendicular to the first direction, to connect second line patterns, positioned on each side of the first line pattern, through the gap in the first direction. A length of the gap exceeds twice the feature size F. At least one jog pattern is formed, extending in the first direction from sides of a first line pattern adjacent to the connected second line patterns, the jog pattern causing formation of a gap in at least one of the connected second line patterns in the second direction. A distance between an end of the jog pattern and a first line pattern adjacent to the jog pattern is less than twice the feature size.

BRIEF DESCRIPTION OF THE DRAWINGS

The embodiments of the present invention will be described with reference to the attached drawings, in which.

DETAILED DESCRIPTION OF THE EMBODIMENTS

Figure 1:
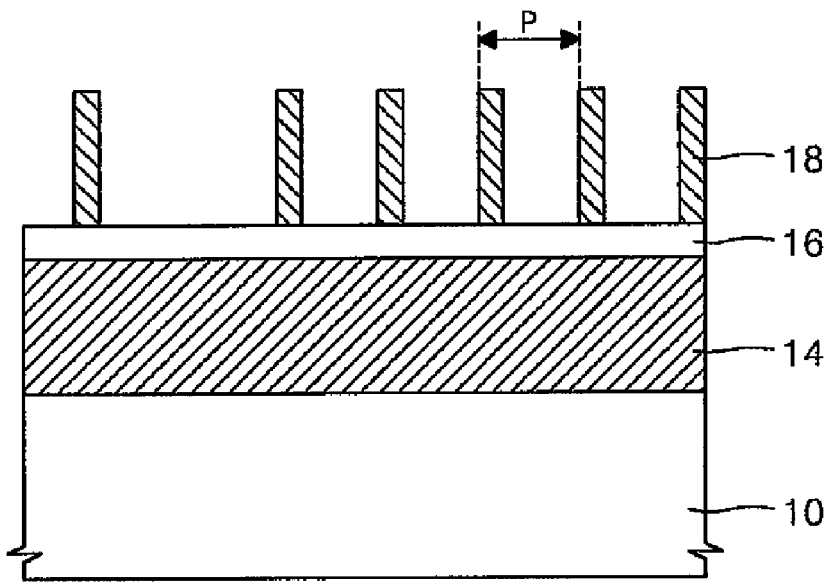
FIG. 1 is a cross-sectional view of fine patterns formed on a semiconductor device using a self-alignment, double patterning process, according to an embodiment of the present invention.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Throughout the drawings and written description, like reference numerals will be used to refer to like or similar elements. Also, thicknesses of layers, spaces, regions and the like depicted in the drawings are exaggerated for clarity.

The present disclosure describes a self-alignment double patterning process as an example of a double patterning technique, used in an embodiment of the present invention to form fine patterns of a semiconductor device, described with reference to the attached drawings. The self-alignment double patterning process minimizes misalignments between first patterns and second patterns.

FIGS. 1 through 6 are cross-sectional views of fine patterns being formed at various stages on a substrate of a semiconductor device using a self-alignment double patterning process, according to an embodiment of the present invention. FIG. 7 is a plan view of the semiconductor device depicted in FIG. 5.

Referring to FIG. 1, a first pattern layer 14 is formed on a semiconductor substrate 10, such as a silicon substrate. The first pattern layer 14 may be formed from polysilicon, for example. An anti-reflection layer 16 may be formed on the first pattern layer 14, and a photoresist pattern 18 is formed on the anti-reflection layer 16. Alternative embodiments do not necessarily need to include the anti-reflection layer 16.

In the fabrication process, the photoresist pattern 18 may be formed in a portion of the semiconductor device having a small pattern density, such as a peripheral area or a core area, and in a portion having a high pattern density, such as a cell array area. The photoresist pattern 18 may have arbitrary pitches, indicated as pitch P, in a high density pattern area. High density pattern areas will be primarily addressed, herein.

Figure 2:
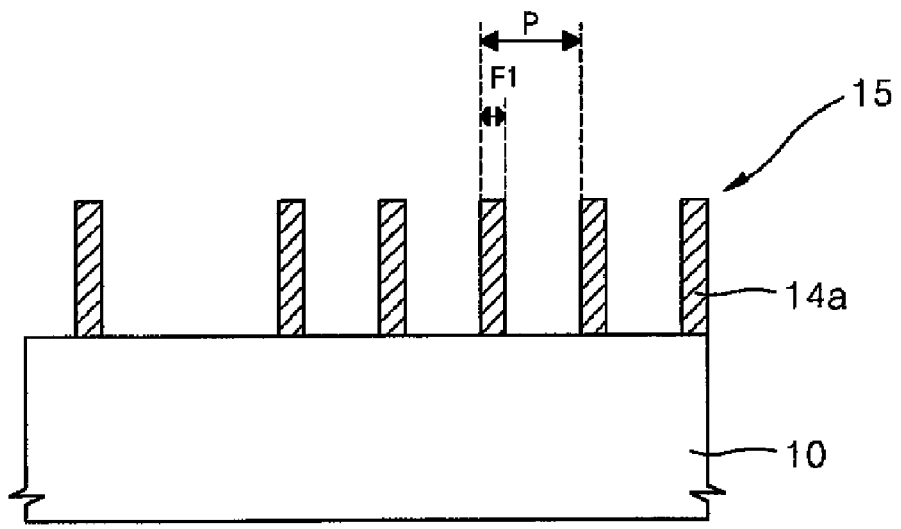
FIG. 2 is a cross-sectional view of fine patterns formed on a semiconductor device using a self-alignment, double patterning process, according to an embodiment of the present invention.

FIG. 2 depicts a portion of the semiconductor device after the first pattern layer 14 has been etched, e.g., anisotropically etched, using the photoresist pattern 18 depicted in FIG. 1 as an etch mask, to form a first pattern 15. The first pattern 15 includes multiple first line patterns, indicated as first line patterns 14a, formed from the etched first pattern layer 14. The photoresist pattern 18 and the anti-reflection layer 16 are removed.

Because the shapes and features of the photoresist pattern 18 are transferred to the first line patterns 14a through the etching process, the first pattern 15 includes the same pitches and feature sizes as the photoresist pattern 18, including, for example, pitch P and feature size F1. In the depicted exemplary embodiment of FIG. 2, the feature size F1 of the first line patterns 14a is ¼ of the pitch P. As a result, the first pattern 15 includes the first line patterns 14a, which have pitch P and feature size F1. Formation of the first patterns 14a is repeated in a predetermined direction (e.g., a first direction of FIG. 7) on the semiconductor substrate 10.

Figure 3:
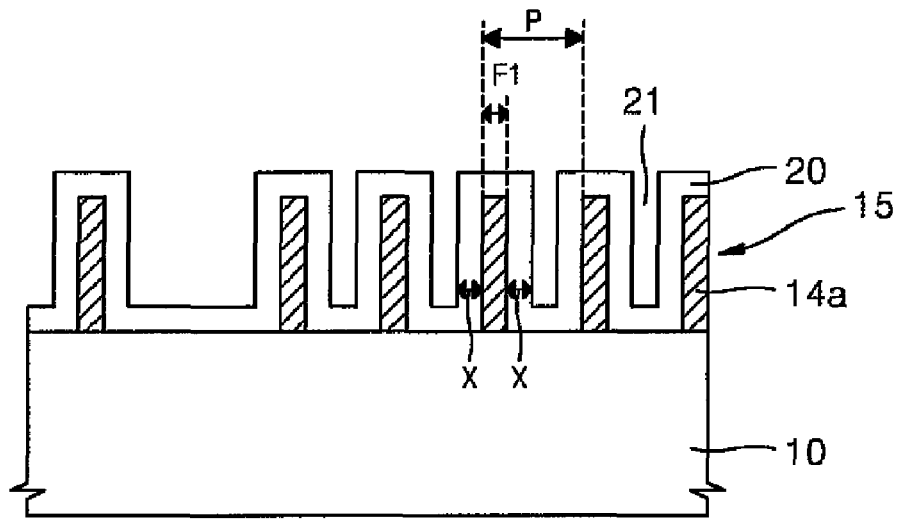
FIG. 3 is a cross-sectional view of fine patterns formed on a semiconductor device using a self-alignment, double patterning process, according to an embodiment of the present invention.

FIG. 3 depicts a capping layer 20, formed on the semiconductor substrate 10, on which the first pattern 15 is formed. The capping layer 20 is formed, for example, from silicon oxide. The capping layer 20 covers upper surfaces and sidewalls of the first line patterns 14a to a uniform thickness X. The thickness X of the capping layer 20 may be ¼ of the pitch P, i.e., equal to the feature size F1 of the first line patterns 14a. Recesses 21 are defined in spaces between every two adjacent first line patterns 14a.

Figure 4:
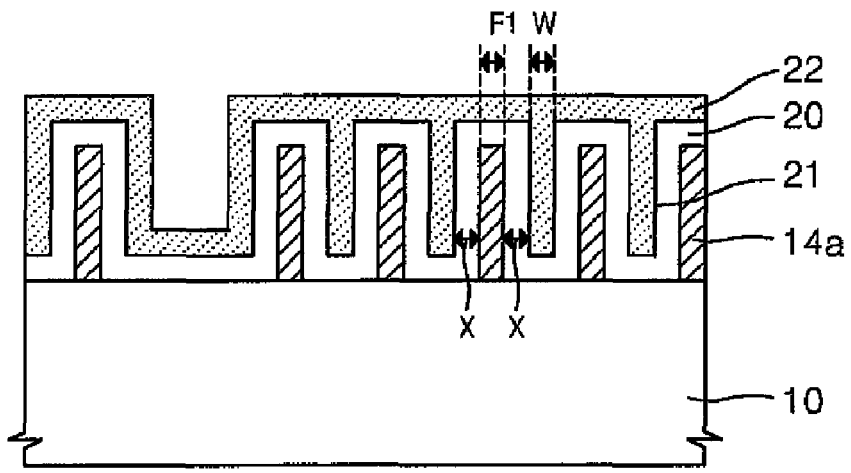
FIG. 4 is a cross-sectional view of fine patterns formed on a semiconductor device using a self-alignment, double patterning process, according to an embodiment of the present invention.

FIG. 4 depicts a second pattern layer 22 formed on the capping layer 20. The second pattern layer 22 fills the recesses 21, and has etching selectivity with the capping layer 20. The second pattern layer 22 is formed, for example, from polysilicon. In the depicted embodiment, the width W of the second pattern layer 22 is the same as the thickness X of the capping layer 20 and the feature F1 of the first line patterns 14a. For example, when the thickness X of the capping layer 20 is ¼ of the pitch P, a width W of the second pattern layer 22 in the recesses 21 is likewise ¼ of the pitch P, i.e., equal to the feature size F1 of the first line patterns 14a.

Figure 5:
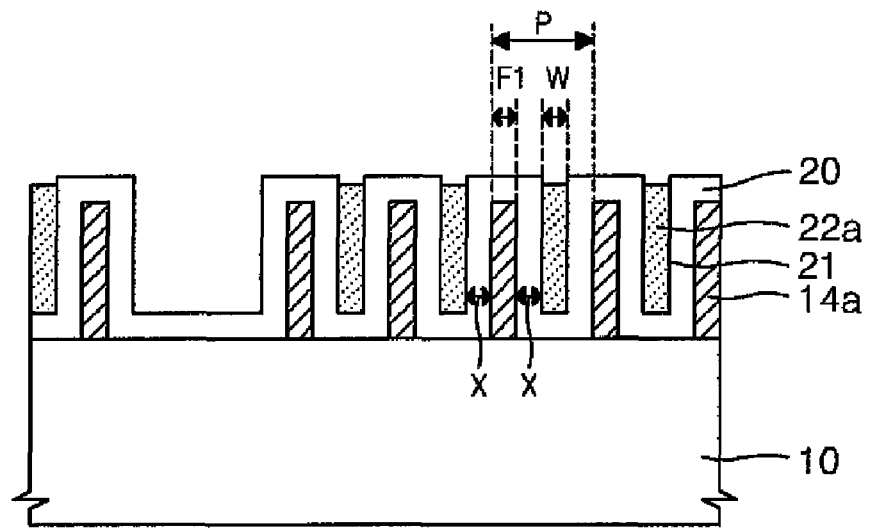
FIG. 5 is a cross-sectional view of fine patterns formed on a semiconductor device using a self-alignment, double patterning process, according to an embodiment of the present invention.

FIG. 5 depicts the semiconductor device in which a portion of the second pattern layer 22 has been selectively removed, for example, using a wet etching process. The remaining portion of the second pattern layer 22, located in the recesses 21, form second line patterns 22a. The second line patterns 22a are repeated in a predetermined direction (e.g., a first direction of FIG. 7) in the recesses 21. The second line patterns 22a are positioned in almost the same horizontal plane as the first line patterns 14a. The capping layer 20 is formed on the first line patterns 14a, although this is not apparent in FIG. 7.

Figure 6:
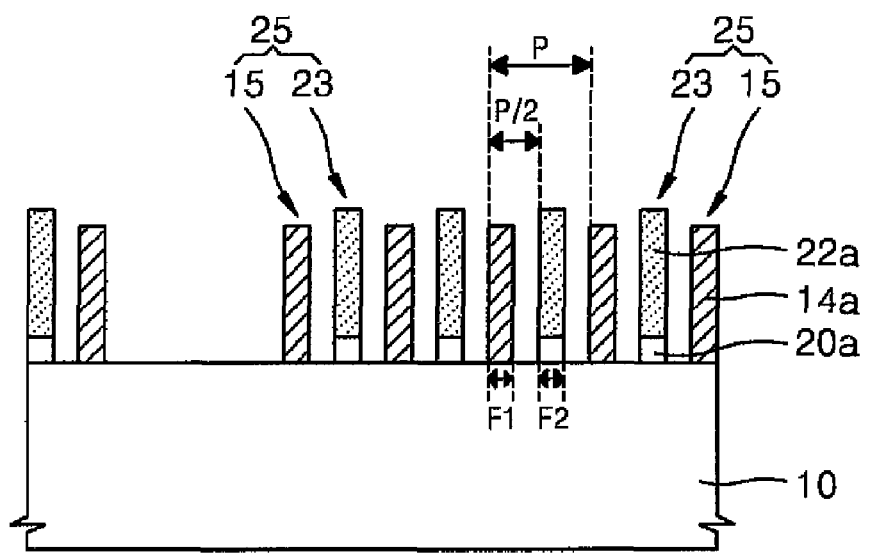
FIG. 6 is a cross-sectional view of fine patterns formed on a semiconductor device using a self-alignment, double patterning process, according to an embodiment of the present invention.
Figure 7:
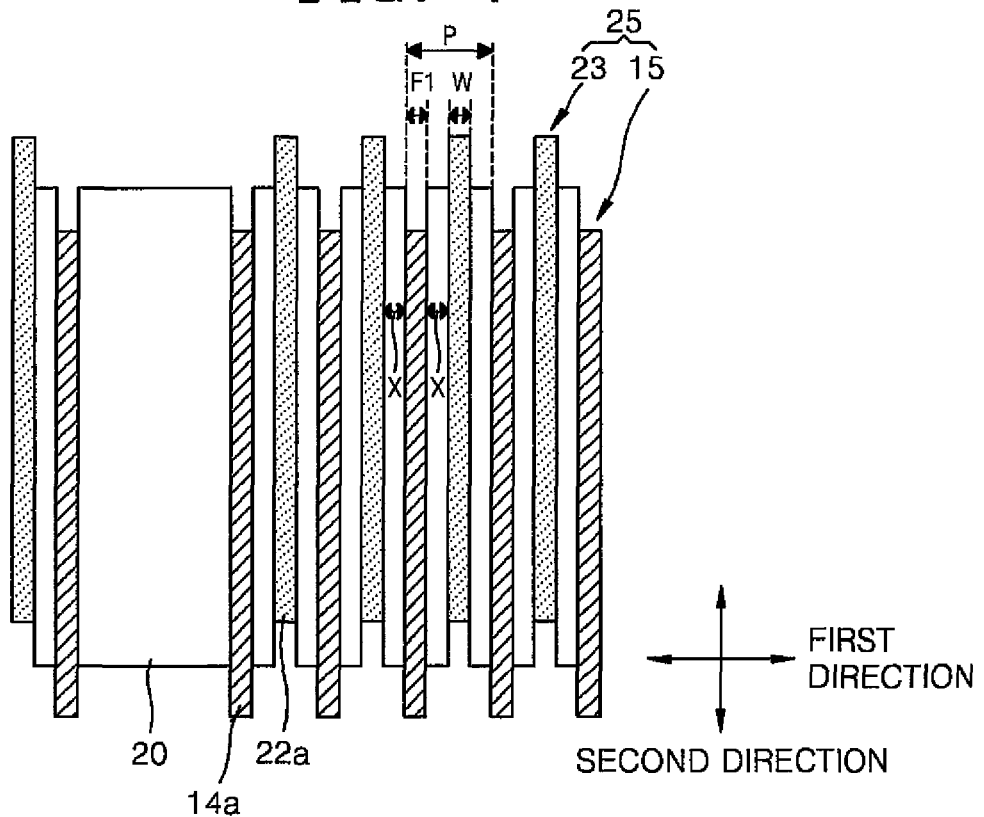
FIG. 7 is a plan view of the semiconductor device of FIG. 5.

FIG. 6 depicts the semiconductor device after capping layer 20 is anisotropically etched, using the first and second line patterns 14a and 22a as masks, where a self-alignment method exposes the semiconductor substrate 10. It is understood that, if an additional layer (not shown) had been formed on the semiconductor substrate 10, that additional layer may be exposed due to the anisotropical etching.

As a result of the anisotropic etching, second pattern 23 is included among the first line patterns 14a of first pattern 15. The second pattern 23 includes the second line patterns 22a and a capping pattern 20a (i.e., portions of the capping layer 20 remaining after the anisotropic etching). A feature size F2 of the second pattern 23 is ¼ of the pitch P, and thus is equal to the feature size F1 of the first pattern 15. As a result, a fine pattern 25 is formed on the semiconductor substrate 10, having a pitch of ½ of the pitch P, due to the combined first pattern 15 and second pattern 23.

When the fine pattern 25 is formed using a self-alignment double patterning process, as described above, the second pattern 23 is formed through a semiconductor fabrication process. Thus, it is difficult to directly reflect a layout of the second pattern 23 on a mask layout. As a result, a layout of the first pattern 15 must be considered to properly estimate the layout of the second pattern 23.

In particular, the fidelity of the first pattern 15 directly affects critical features of the second pattern 23, including dimension uniformity and line width roughness, which are important to circuit integrity of the semiconductor device. Therefore, the first line patterns 14a are repeated in a resolution adjustment direction, i.e., in the first direction of FIG. 7, to precisely form the first pattern 15 in a photolithography process For example, an exposure apparatus, e.g., a photolithography apparatus, includes an illumination system, e.g., a dipole illumination system, positioned in a direction orthogonal to the resolution adjustment direction, i.e., in the second direction of FIG. 7, in order to repeat the first line pattern 14a in the resolution adjustment direction. As a result, resolution may be more finely adjusted in the first direction than in the second direction using the illumination system of the photolithography apparatus.

However, when fine patterns are formed using the double patterning process, as described for example with reference to FIGS. 1 through 6, the first line patterns 14a may be separated or cut in a direction orthogonal to the resolution adjustment direction, i.e., the second direction of FIG. 7, forming a gap in the first line patterns. Also, the first line patterns 14a may be separated or cut during the semiconductor fabrication process in the second direction of FIG. 7. Addressing these circumstances without having to incorporate a trimming process is discussed below, referencing FIGS. 8 through 11.

Figure 8:
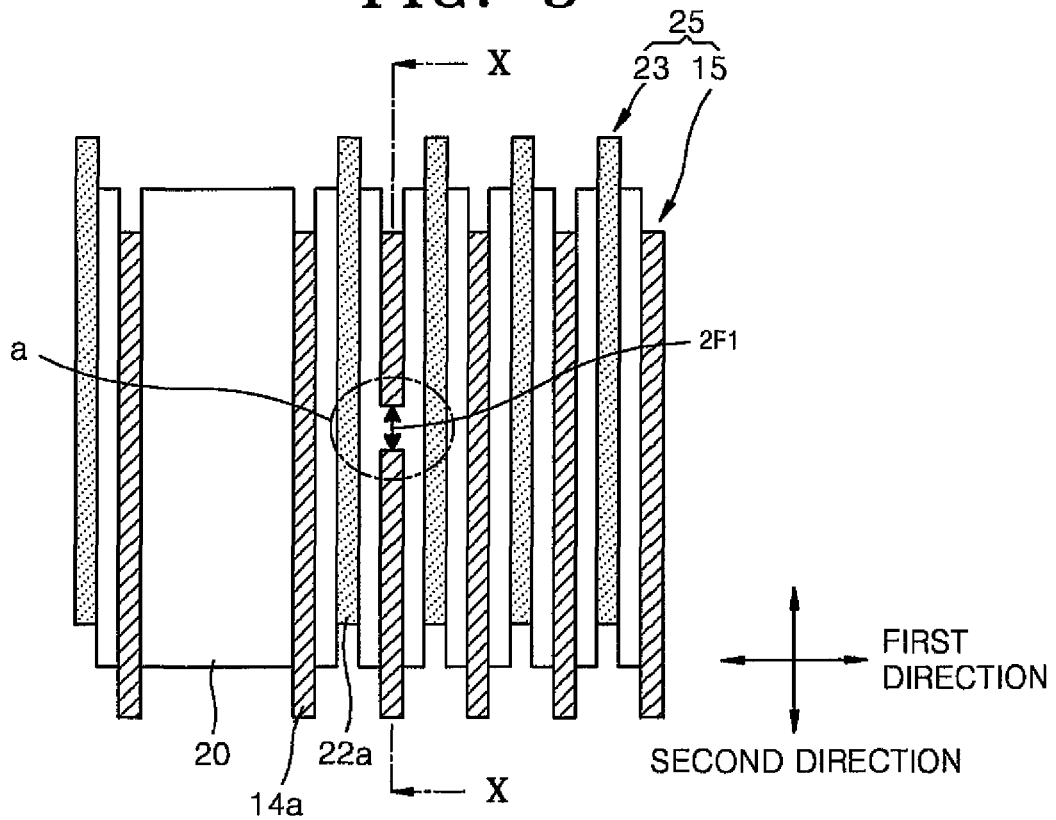
FIG. 8 is a plan view illustrating a layout of a semiconductor device having first line patterns, according to an embodiment of the present invention.
Figure 9:
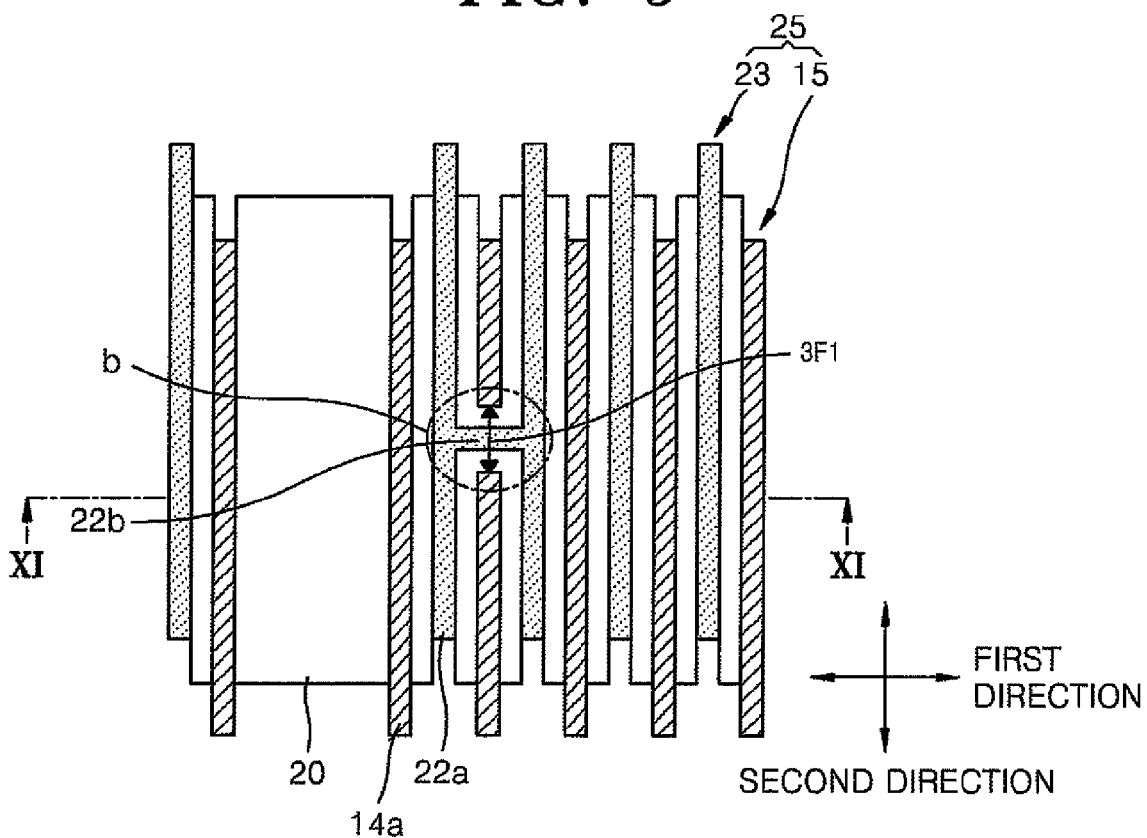
FIG. 9 is a plan view illustrating a layout of a semiconductor device having first line patterns, according to an embodiment of the present invention.
Figure 10:
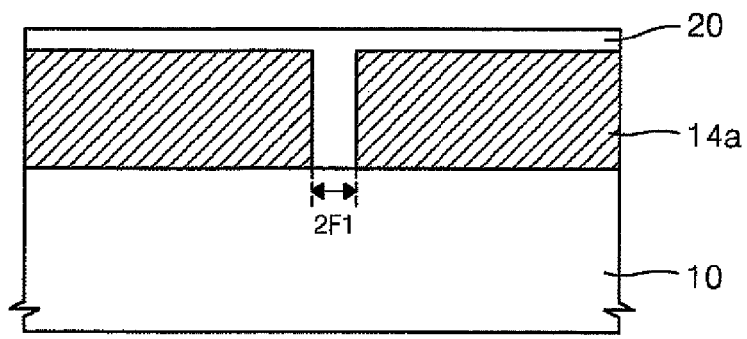
FIG. 10 is a cross-sectional view taken along line X-X of FIG. 8.
Figure 11:
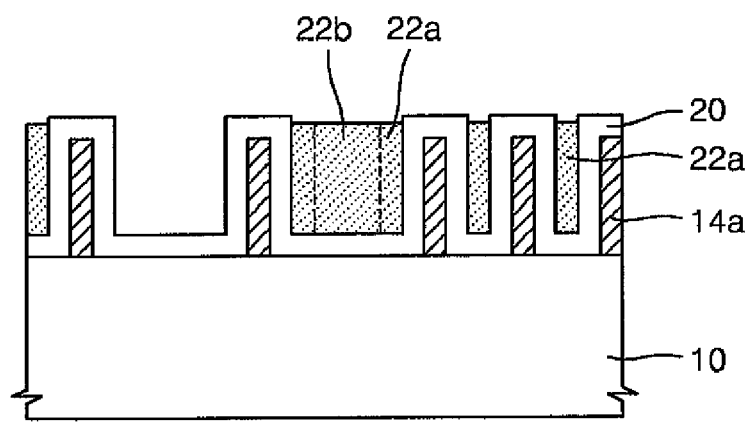
FIG. 11 is a cross-sectional view taken along line XI-XI of FIG. 9.

FIGS. 8 and 9 are plan views illustrating layouts of semiconductor devices having first and second line patterns, in which one of the first line patterns is severed in a direction orthogonal to a resolution adjustment direction, forming a gap in the first line pattern. FIG. 10 is a cross-sectional view of the semiconductor device taken along line X-X of FIG. 8, and FIG. 11 is a cross-sectional view of the semiconductor device taken along line XI-XI of FIG. 9

Referring to FIG. 8, one of the first line patterns 14a is severed in the second direction, which is the direction orthogonal to the resolution adjustment direction. The resulting gap is indicated by reference character "a," which shows a space between the separate portions of the first line pattern 14a. The size of the gap may be up to twice the feature size F1 of the first pattern 15 and/or first line patterns 14a, indicated as 2F1. When the feature size F1 is equal to the thickness X of the capping layer 20 covering the first line patterns 14a, the distance 2F1 may also be indicated as 2X.

When the distance between the severed portions of the depicted first line pattern 14a is less than 2F1, the capping layer 20, as applied in FIG. 3, fills the gap between the separate portions of the first line pattern 14a, as shown in FIG. 8 and in the corresponding cross-sectional view of FIG. 10. Thus, the first line pattern 14a remains separated during the fabrication process, and the adjacent second line patters 22a are unchanged. However, because the gap between the separate portions of the first line pattern 14a is relatively small, e.g., less than 2F1, and is situated in a direction orthogonal to the resolution adjustment direction, it may not be possible to create the gap in the first line pattern 14a using the photolithography process. This is because resolution cannot be as finely adjusted in the second direction as in the first direction, as discussed above.

In comparison, FIG. 9 also depicts the first line pattern 14a severed or cut in the second direction, i.e., a direction orthogonal to the resolution adjustment direction, although the space between the separate portions of the first line pattern 14a, indicated by reference character "b," is larger than twice the feature size F1. More particularly, the depicted embodiment shows a distance of 3F1, which is three times the feature size F1 of the first pattern 15 and/or first line patterns 14a. When the feature size F1 is equal to the thickness X of the capping layer 20 covering the first line pattern 14a, then 3F1 may also be indicated as 3X.

When the distance between the severed portions of the first line pattern 14a exceeds 2F1, e.g., 3F1 as shown in FIG. 9, the second pattern layer 22, as applied in FIG. 4, is deposited within the gap between the separate portions of the first line pattern 14a. As a result, the second line patterns 22a, adjacent to both sides of the first line pattern 14a having the gap, are connected (short-circuited) to one another through a connection pattern (bridge pattern) 22b, as shown in FIG. 9 and in the corresponding cross-sectional view of FIG. 11. Conventionally, the second line patterns 22a cannot be separated, unless the connection pattern 22b is removed, e.g., using an additional trimming process.

However, in an embodiment of the present invention, a layout of the first pattern 15 may be altered so that the second line patterns 22a are formed as individual line patterns, even when the first line patterns 14a include gaps in the second direction greater than 2F1. More particularly, according to an embodiment, jog patterns may be formed projecting from the line patterns 14a, such that the ends of the jog patterns extend in the first direction, i.e., the resolution adjustment direction. The jog patterns create an open-circuit in the second line patterns 22a in the second direction, counteracting the effects of the connection pattern 22b, as described below with reference to FIGS. 12 to 15.

Figure 12:
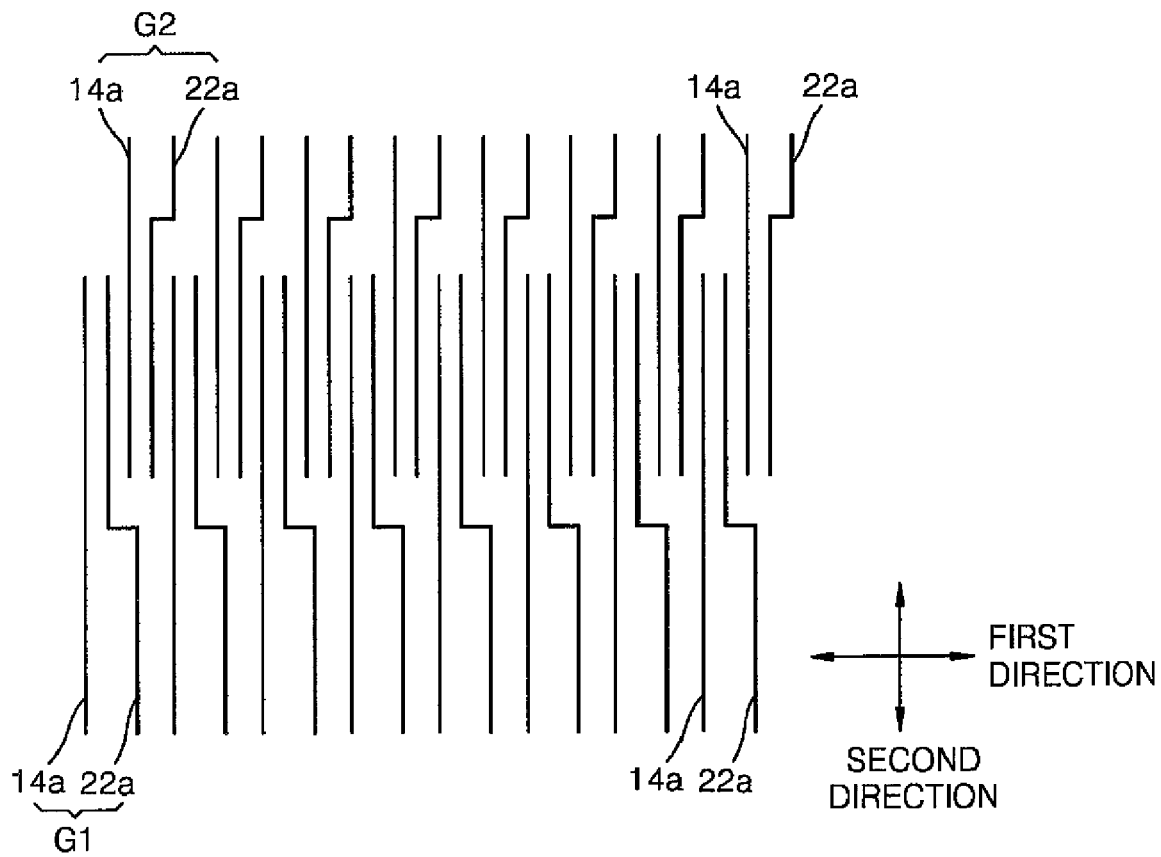
FIG. 12 illustrates a layout of a semiconductor device, according to an embodiment of the present invention.

FIG. 12 illustrates a layout of a semiconductor device according to an embodiment of the present invention. Generally, a first set of two line patterns is disposed so that their ends face in a first direction (e.g., upward), and a second set of two line patterns is disposed so that their ends face in a second direction, opposite to the first direction (e.g., downward). Positioning the line patterns in this manner, for example, secures areas of contact holes or through holes in the layout of the semiconductor device. More particularly, as shown in FIG. 12, a first line pattern 14a and a second line pattern 22a having ends disposed upwardly are classified into a first group G1. A first line pattern 14a and a second line pattern 22a having ends disposed downwardly are classified into a second group G2, adjacent to the first group G1. The first and second groups G1 and G2 may be set in units to be repeated in the first direction.

Figure 13:
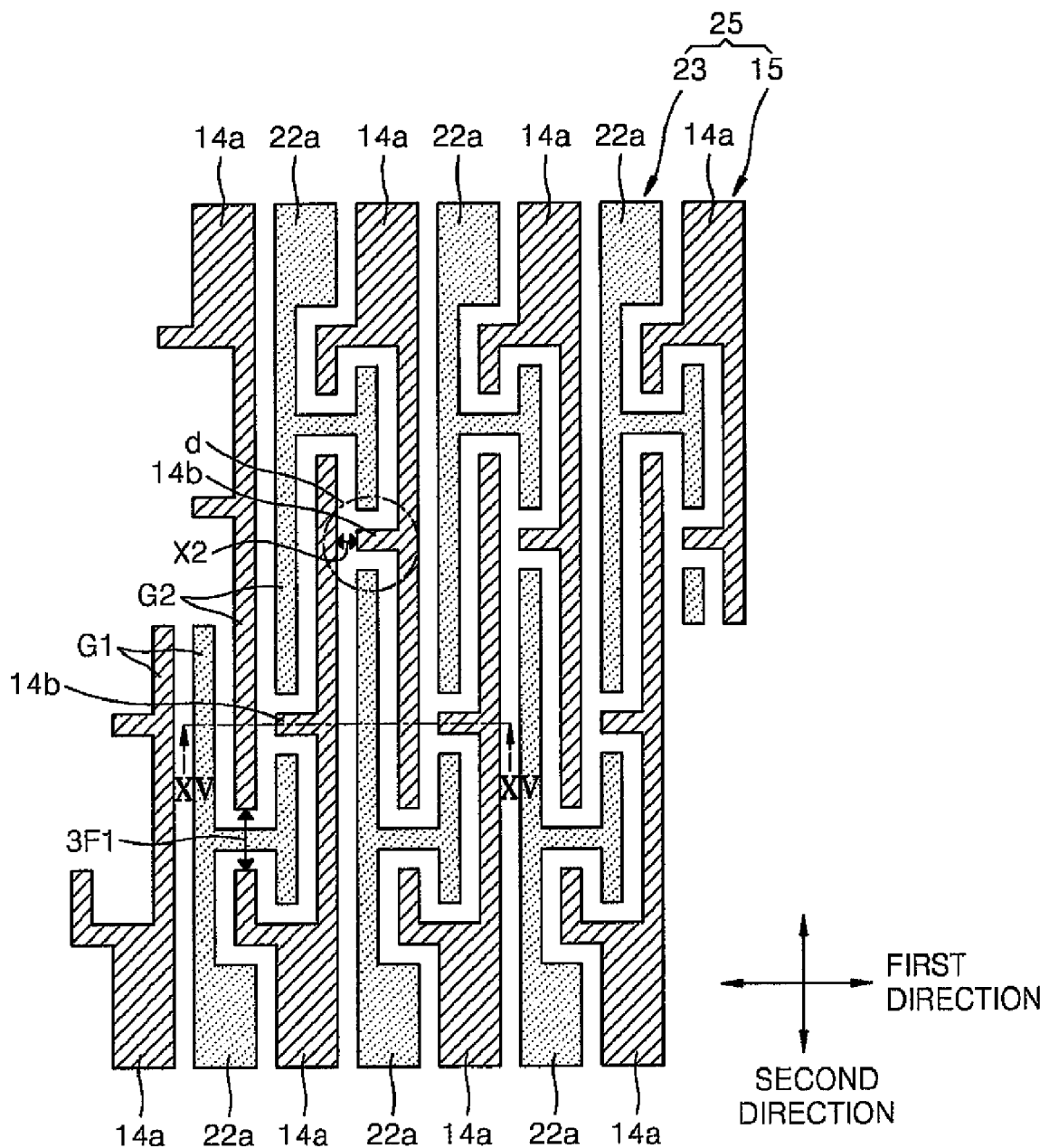
FIG. 13 is a plan view illustrating a layout of a semiconductor device, according to another embodiment of the present invention.
Figure 14:
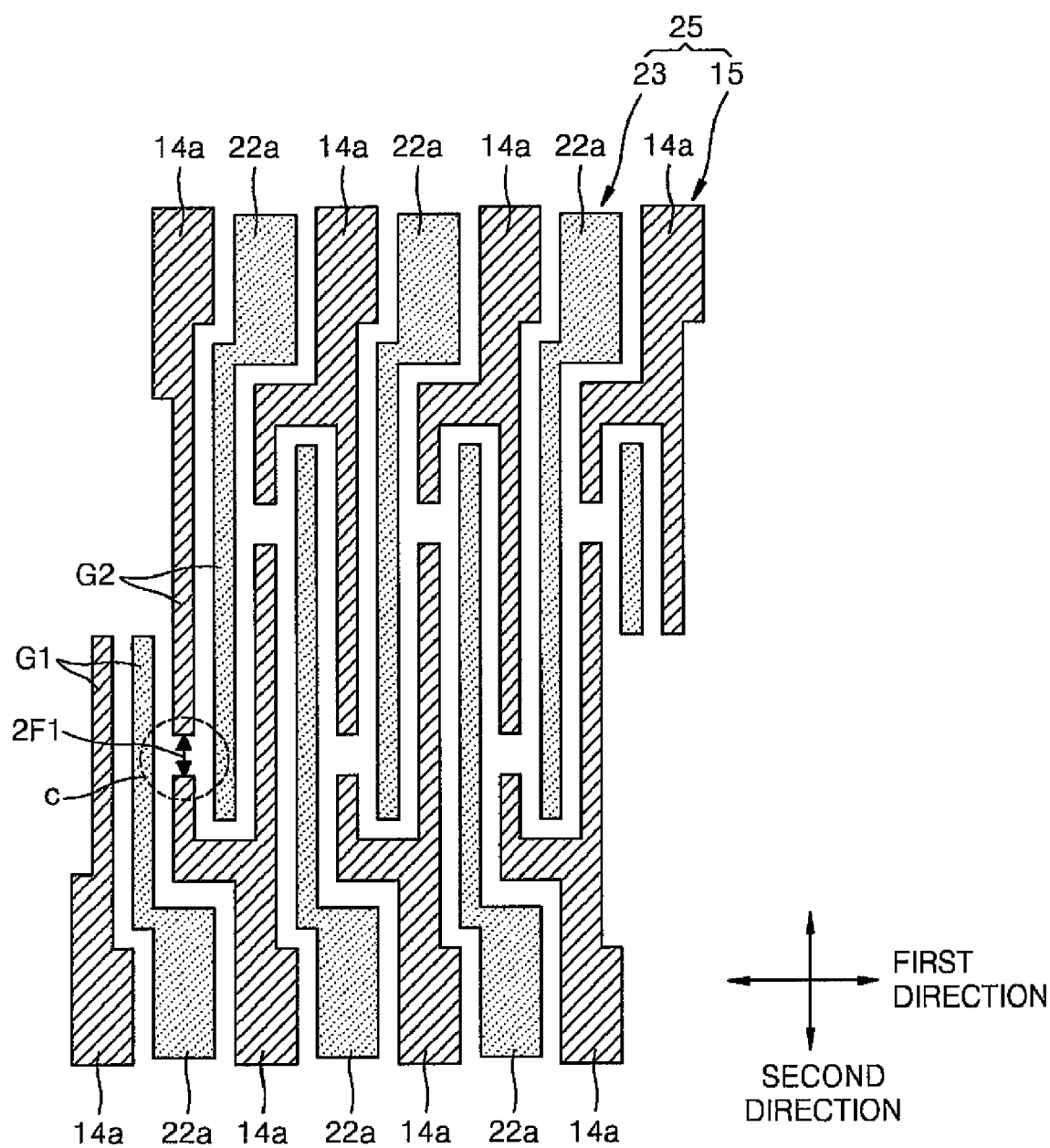
FIG. 14 is a plan view of a semiconductor device, according to another embodiment of the present invention.
Figure 15:
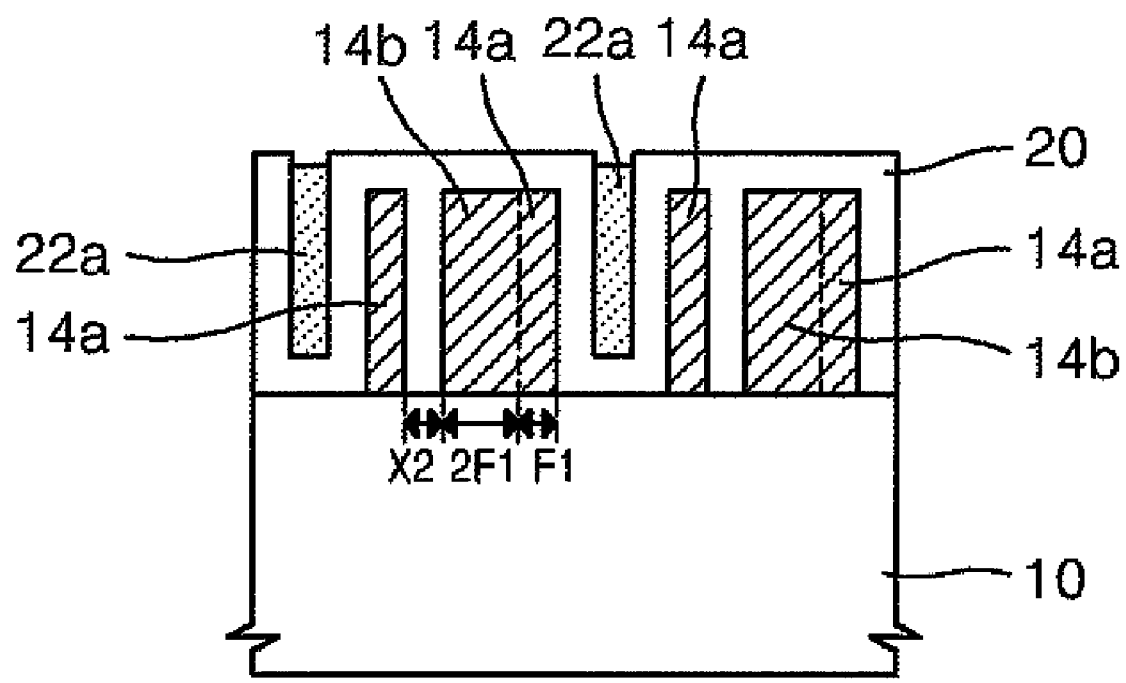
FIG. 15 is a cross-sectional view taken along line XV-XV of FIG. 13.

FIG. 14 is a plan view illustrating an exemplary layout of a semiconductor device, according to an embodiment of the present invention. FIG. 13 is a plan view illustrating another exemplary layout of a semiconductor device, according to an embodiment of the present invention, and FIG. 15 is a cross-sectional view taken along line XV-XV of FIG. 13. In particular, FIG. 13 depicts a changed layout of the first pattern 15, using larger gap sizes and jog patterns in the first line patterns 14a.

Referring first to FIG. 14, to implement the layout of FIG. 12, the first line patterns 14a are severed in a second direction, i.e., a direction perpendicular to the resolution adjustment direction. The gaps between the separate portions of the first line patterns 14a are 2F1 in length (or less), as indicated by the reference character "c." In this case, though, it is difficult to realize the first line patterns 14a having 2F1 gaps in the second direction using a photolithography apparatus, since it is perpendicular to the resolution adjustment direction.

Referring to FIG. 13, the first line patterns 14a are likewise severed in the second direction, although the gaps between the separate portions of the first line patterns 14a are greater in length than twice the feature size F1. For example, the depicted gaps are three times F1 in length, indicated by the reference 3F1. Because of the larger gap size, it is easier to realize the first line patterns 14a having 3F1 gaps in the second direction using a photolithography apparatus, as described above.

However, when the first line patterns 14a are formed as shown in FIG. 13, the second line patterns 22a positioned on either side the first line patterns 14a may connect to one another in the first direction via the gaps, e.g., by connection patterns 22b shown in FIG. 9. Therefore, the connected second line patterns 22a must be severed in the second direction, e.g., in order to negate the effects of the short circuits through the connection patterns 22b. Thus, jog patterns 14b, having ends extending in the first direction, i.e., the resolution adjustment direction, have been formed projecting from the first line patterns 14a adjacent to the connected second line patterns 22a, as indicated by the reference character "d" of FIG. 13 and as shown in FIG. 15. The jog patterns 14b cause gaps in the second line patterns 22a in a second direction to address the short-circuits caused by the gaps in the first line pattern 14a.

When distances X2 (in a first direction) between the ends of the jog patterns 14b and the nearest adjacent first line patterns 14a are less than 2F1, i.e., twice the feature size F1, the second line patterns 22a are severed in the second direction. For convenience of explanation, the widths of the jog patterns 14b depicted in FIGS. 13 and 15 are 2F1.

Accordingly, when fine patterns 25 are formed using double patterning, the first line patterns 14a may be cut in the second direction. Also, the second line patterns 22a adjacent to the severed first line patterns 14a may be connected to one another in the first direction, e.g., when the gap in the first line patterns 14a exceeds twice the feature size F1. The connected second line patterns 22a may be open circuited in the second direction using jog patterns 14b formed at sides of the first line patterns 14a and projecting in the first direction. Thus, the fine patterns 25, including the first and second patterns 15 and 23, can be more easily and efficiently formed, regardless of a resolution adjustment direction.

Thus, as described above, first line patterns 14a can be open circuited in a direction perpendicular to a resolution adjustment direction (i.e., in a second direction) regardless of a resolution. Also, jog patterns 14b are formed at the first line patterns 14a adjacent to second line patterns 22a in the resolution adjustment direction to open circuit the second line patterns in the direction perpendicular to the resolution adjustment direction (i.e., in a second direction). As a result, the second line patterns 22a can be independent, separate line patterns using a double patterning technique, without having to use a trimming process.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method of forming fine patterns of a semiconductor device, the method comprising:
    forming a first pattern on a semiconductor substrate, the first pattern comprising a plurality of first line patterns having a feature size F and an arbitrary pitch P, the plurality of first line patterns being repeated in a first direction;
    forming a second pattern comprising a plurality of second line patterns formed between adjacent first line patterns of the plurality of first line patterns to form a fine pattern having a half pitch P/2, the plurality of second line patterns being repeated in the first direction;
    forming a gap in at least one first line pattern of the plurality of first line patterns in a second direction, perpendicular to the first direction, to connect second line patterns positioned on each side of the at least one first line pattern through the gap; and
    forming at least one jog pattern, extending in the first direction from at least one first line pattern adjacent to the connected second line patterns, the at least one jog pattern causing a gap in at least one of the connected second line patterns in the second direction.

2. The method of claim 1, wherein the gap in the at least one first line pattern exceeds twice the feature size F.

3. The method of claim 2, wherein a distance extending in the first direction between an end of the at least one jog pattern and a first line pattern adjacent to the at least one jog pattern is less than twice the feature size F.

4. The method of claim 1, wherein forming the first pattern comprises use of an illumination system of a photolithography apparatus, such that a resolution is more finely adjusted in the first direction than in the second direction.

5. The method of claim 1, wherein each of the plurality of second line patterns comprises a width of ¼ of the pitch P.

6. The method of claim 1, wherein the fine patterns comprise line and space patterns.

7. The method of claim 1, further comprising:
   classifying a first one of the plurality of first line patterns and an adjacent first one of the plurality of second line patterns into a first group; and
   classifying a second one of the plurality of first line patterns and an adjacent second one of the plurality of second line patterns into a second group, the first and second line patterns of the second group extending in an opposite direction from the first and second line patterns of the first group,
   wherein the first group and the second group are repeated in the first direction.

8. A method of forming fine patterns of a semiconductor device, the method comprising:
   forming a first pattern on a semiconductor substrate, the first pattern comprising a plurality of first line patterns having a pitch P and a feature size F, the first line patterns being repeated in a first direction;
   forming a capping layer over upper surfaces and sidewalls of each of the first line patterns, the capping layer defining recesses between adjacent first line patterns;
   forming a second pattern comprising a plurality of second line patterns, the second line patterns being repeated in the first direction in the recesses;
   anisotropically etching the capping layer, using the plurality of first line patterns and the plurality of second line patterns as etch masks, to form a fine pattern having a half pitch P/2;
   forming a gap in at least one first line pattern of the plurality of first line patterns in a second direction, perpendicular to the first direction, to connect second line patterns, positioned on each side of the at least one first line pattern, through the gap in the first direction; and
   forming at least one jog pattern, extending in the first direction from at least one first line pattern adjacent to the connected second line patterns, the at least one jog pattern causing formation of a gap in at least one of the connected second line patterns in the second direction.

9. The method of claim 8, wherein the gap in the at least one first line pattern exceeds twice the feature size.

10. The method of claim 9, wherein a distance in the first direction between an end of the at least one jog pattern and a first line pattern adjacent to the at least one jog pattern is less than twice the feature size.

11. The method of claim 8, wherein forming the first pattern comprises use of an illumination system of a photolithography apparatus, such that a resolution is more finely adjusted in the first direction than in the second direction.

12. The method of claim 8, further comprising:
   classifying a first one of the plurality of first line patterns and an adjacent first one of the plurality of second line patterns into a first group; and
   classifying a second one of the plurality of first line patterns and an adjacent second one of the plurality of second line patterns into a second group, the first and second line patterns of the second group extending in an opposite direction from the first and second line patterns of the first group,
   wherein the first group and the second group are repeated in the first direction.

13. The method of claim 8, wherein the feature size is equal to a thickness of the capping layer.

14. The method of claim 8, wherein forming the second pattern comprises:
   forming a second pattern layer, having etch selectivity with the capping layer, on the capping layer; and
   removing a portion of the second pattern layer to form the plurality of second line patterns in the recesses.

15. The method of claim 14, wherein removing the portion of the second pattern layer comprises wet etching.

16. The method of claim 8, wherein each of the plurality of second line patterns comprises a width of ¼ of the pitch P.

17. The method of claim 8, wherein the fine pattern comprises a line and space pattern.

18. A method of forming fine patterns of a semiconductor device, the method comprising:
   forming a first pattern on a semiconductor substrate, the first pattern comprising a plurality of first line patterns having a pitch P and a feature size F, the first line patterns being repeated in a first direction;
   forming a capping layer over upper surfaces and sidewalls of each of the first line patterns, the capping layer defining recesses between adjacent first line patterns;
   forming a second pattern comprising a plurality of second line patterns, the second line patterns being repeated in the first direction in the recesses;
   anisotropically etching the capping layer, using the plurality of first line patterns and the plurality of second line patterns as etch masks to form a fine pattern having a half pitch P/2;
   forming a gap in at least one first line pattern of the plurality of first line patterns in a second direction, perpendicular to the first direction, to connect second line patterns, positioned on each side of the at least one first line pattern, through the gap in the first direction, a length of the gap exceeding twice the feature size F; and
   forming at least one jog pattern, extending in the first direction from a side of at least one of the first line patterns adjacent to the connected second line patterns, the at least one jog pattern causing formation of a gap in at least one of the connected second line patterns in the second direction, a distance between an end of the at least one jog pattern and a first line pattern adjacent to the at least one jog pattern being less than twice the feature size.

19. The method of claim 18, wherein the first pattern is formed using an illumination system of a photolithography apparatus, a resolution of the illumination system being more finely adjusted in the first direction than in the second direction.

20. The method of claim 18, wherein a first one of the plurality of first line patterns and an adjacent first one of the plurality of second line patterns comprise a first group; and a second one of the plurality of first line patterns and an adjacent second one of the plurality of second line patterns comprise a second group, the first and second line patterns of the second group extending in an opposite direction from the first and second line patterns of the first group.

* * * * *